United States Patent
Kephart, Jr. et al.

(10) Patent No.: US 6,307,383 B1
(45) Date of Patent: Oct. 23, 2001

(54) FLYBACK TRANSFORMER AND YOKE TESTER

(76) Inventors: Elver B. Kephart, Jr., 136 Woody Thomas Dr., Lavergne, TN (US) 37086; Nove J. Kephart, Sr., 179 Layman Rd., Trenton, TN (US) 38382

( * ) Notice: Subject to any disclaimer, the term of this patent is extended or adjusted under 35 U.S.C. 154(b) by 0 days.

(21) Appl. No.: 08/689,135

(22) Filed: Jul. 30, 1996

Related U.S. Application Data

(63) Continuation-in-part of application No. 08/463,342, filed on Jun. 5, 1995, now abandoned.

(51) Int. Cl.[7] ................................................ G01R 31/06
(52) U.S. Cl. ........................... 324/547; 324/546; 324/726
(58) Field of Search ................................. 324/547, 548, 324/415, 546, 726

(56) References Cited

U.S. PATENT DOCUMENTS

| | | | |
|---|---|---|---|
| 2,990,514 | * | 6/1961 | Johnson ................................ 324/547 |
| 3,659,197 | | 4/1972 | Alley et al. . |
| 3,769,576 | * | 10/1973 | Norkaitis ............................... 324/546 |
| 3,934,194 | * | 1/1976 | Paprocki ............................... 324/547 |
| 3,990,002 | | 11/1976 | Baum . |
| 4,064,454 | * | 12/1977 | Yoshino et al. ....................... 324/547 |
| 4,191,921 | * | 3/1980 | Yoshino ................................ 324/547 |
| 4,547,723 | | 10/1985 | McLellan . |
| 4,746,869 | | 5/1988 | Schrag et al. . |
| 4,864,242 | * | 9/1989 | Hurley .................................. 324/546 |
| 5,256,977 | * | 10/1993 | Domenichini ........................ 324/546 |
| 5,296,818 | | 3/1994 | Vrablec . |
| 5,345,181 | * | 9/1994 | Mantani et al. ...................... 324/546 |
| 5,416,419 | * | 5/1995 | Witt ...................................... 324/551 |
| 5,500,598 | * | 3/1996 | Ford ..................................... 324/547 |
| 5,514,967 | * | 5/1996 | Zelm .................................... 324/551 |
| 5,717,338 | * | 2/1998 | Cook .................................... 324/547 |
| 5,923,173 | * | 7/1999 | Yu ........................................ 324/547 |

* cited by examiner

*Primary Examiner*—Glenn W. Brown
(74) *Attorney, Agent, or Firm*—Waddey & Patterson; Mark J. Patterson

(57) ABSTRACT

An apparatus is disclosed for testing the integrity of inductive coils such as yokes, flyback transformers, and the like. The apparatus includes a compact housing which makes it portable and convenient for field use. The apparatus includes circuitry disposed in the housing for inducing current through the inductive coil being tested. An array of LED's is provided to give the operator a visual display which is indicative of the condition of the inductive coil. The apparatus also includes means for connecting a meter or oscilloscope to the circuit in order to examine the electrical signature from the inductive coil being tested.

16 Claims, 3 Drawing Sheets

FLYBACK TRANSFORMER AND YOKE TESTER

CROSS-REFERENCE TO RELATED APPLICATION

This application is a continuation-in-part application of Ser. No. 08/463,342 filed Jun. 5, 1995, now abandoned.

BACKGROUND OF THE INVENTION

1. Field of the Invention

The present invention relates to an apparatus for testing the electrical integrity of an inductive coil, solenoid, or core and coil assembly. The invention specifically relates to such apparatuses which are compact and capable of providing visual displays corresponding to the test results.

2. Description of the Prior Art

It is well known that devices employing electrical coils are subject to numerous defects and failure during operation. Electrical coils are used to develop magnetic fields which can be used to perform functions such as counting the number of revolutions of a rotating member and actuating hydraulic cylinders. Additionally, electrical coils are often used to perform various functions in solid state devices such as television sets and display monitors.

In many of these applications, a failure of the coil or solenoid is often undetected, thereby leading to serious consequences. For example, if a magnetic sensor coil becomes short circuited or electrically open, it will not respond to the passage of the metal segment to induce a voltage pulse accordingly. The absence of this voltage pulse is often likely to go undetected. In a hydraulic cylinder, the solenoid may be short-circuited. This will result in the failure to actuate or deactuate a cylinder, thus leading to mechanical damage in the machine or to the product which it is producing. In such applications, the output voltage from the electrical system may vary from the nominal 12 volts depending on the electrical load on the system. The variable voltage being supplied to the solenoid makes it extremely difficult to design a test circuit for on-line testing of the solenoid's electrical integrity. Additional complications arise due to the fact that an on-line test must be such that it does not actuate the solenoid.

Defects may also occur during the manufacture of coils, the most common of which is that of a shorted turn or turns. Such a defect is relatively difficult to identify in a manner compatible with high volume production. One reason for this is that many apparatus lack the sensitivity to quickly isolate a single shorted turn within a coil containing several hundred turns. Another defect which may occur is that of corona discharge between high and low potential components.

With the advent of solid state television sets and cathode ray tube (crt) monitors, a need has arisen for a small, portable field instrument for testing inductive coils, including yokes and flyback transformers. In order to isolate or detect the cause of a problem in the sweep circuits of a television, it was common to substitute the inductive coil of a test instrument for the yoke of the television set or crt monitor, and subsequently measuring the amount of power delivered to the substitute inductive coil. If the problem were fixed, then it would be apparent that the yoke was defective. However, modern solid state televisions and crt monitors employ complex circuitry which make it difficult to provide a universal substitute inductive coil which will not overload the sweep circuits.

One method which has been reliably used to test yoke coils and transformer windings is a ringing test. Using this testing method, a narrow voltage pulse is applied to the inductive coil to cause it to ring, or resonate, thereby producing a dampened sine wave. Any defects in the inductive coil may be determined by analyzing the dampened sine wave on an oscilloscope. This test however is highly sophisticated and requires a skilled operator to properly adjust the oscilloscope. Furthermore, it is impractical for field operators to transport an oscilloscope to each test site.

The prior art makes many attempts at providing various apparatus and circuitry for testing inductive coils, solenoids, and the like. For example, U.S. Pat. No. 3,659,197 issued on Apr. 25, 1972 to Alley et al. discloses an apparatus for electrically testing an electrical coil. The apparatus includes a primary inductive coil and core assembly adapted to be magnetically coupled to the coil being tested. A pick-up coil is magnetically coupled to the core and coil assembly. A limited source of high voltage direct current is provided along with switching means in order to repetitively apply the current to the primary coil of the core and coil assembly. Detection means are electrically connected to the pick-up coil so that any defects in the coil being tested will be reflected back to the detection means via the pick-up coil.

U.S. Pat. No. 3,990,002 issued on Nov. 2, 1976 to Baum discloses a method and apparatus for testing television yokes and flyback windings. The apparatus includes a number of capacitors which are successively connected across a coil while a train of driving pulses is applied. The pulses cause the coil to ring after each driving pulse. The number of cycles which occur in the ringing signal between the two voltage levels thereof are counted to indicate whether or not the coil is defective.

U.S. Pat. No. 4,547,723 issued on Oct. 15, 1985 to McLellan discloses a device for detecting shorted turns in the windings of electromagnetic coils or transformers. The device utilizes the inductive kick voltage that is developed when the current through a coil is quickly interrupted. Rectified alternating current provides power while a high speed switch controls the current flow through the coil being tested. The device is also capable of measuring the voltage developed by the inductive kick.

U.S. Pat. No. 4,746,869 issued on May 24, 1988 to Schrag et al. discloses a circuit for detecting shorted turns in inductive coils and solenoids. The circuit includes a computer activated device for selectively imposing a direct current voltage on a coil. A detector is used to detect current flow through the coil induced by the voltage and for producing a current flow signal indicative of the magnitude of the current flow. A comparator compares the instantaneous signal with the reference signal and a computer determines whether the respective first and second comparison signals are produced during a first or second point in time, thus indicating the integrity of the coil.

U.S. Pat. No. 5,296,818 issued on Mar. 22, 1994 to Vrablec discloses an electrical tester for the control yoke of an oil-filled, electrically powered switch. The tester includes connectors which are adapted to be interfitted into electrical contact with the yoke. Indicators which are electrically connected to the connectors are used to indicate the flow of electrical current through the yoke. The apparatus may also be used to isolate the source of a fault in the transfer of control signals between the yoke and the electrical switch of the power distribution system.

None of the above inventions and patents, taken either singly or in combination, is seen to describe the instant invention as claimed.

SUMMARY OF THE INVENTION

Accordingly, it is a principal object of the invention to provide an apparatus capable of easily determining the integrity of the windings in an inductive coil.

It is another object of the invention to provide an apparatus which includes output means for operatively coupling a meter or an oscilloscope.

It is a further object of the invention to provide an apparatus capable of visually alerting an operator of the integrity of the windings of an inductive coil under test.

Still another object of the invention is to provide an apparatus which allows an operator to vary the impedance through the inductive coil being tested.

It is an object of the invention to provide improved elements and arrangements thereof in an apparatus for the purposes described which is inexpensive, dependable and fully effective in accomplishing its intended purposes.

In accordance with the objects of the invention, an apparatus is provided for testing the integrity of the windings in an inductive coil. The apparatus includes a housing which has a front panel. The housing contains circuitry which is used to test the integrity of the inductive coil. A power supply is also disposed within the housing. The power supply is used to impose direct current on the circuitry, thereby inducing a current flow through the circuitry.

In accordance with another object of the invention, the apparatus includes a housing which has a front panel. Circuitry is disposed within the housing in order to test the windings of the inductive coil, while a power supply is disposed within the housing in order to impose direct current on the circuitry. The circuitry also includes means for generating a waveform and creating a control signal for switching current through the inductive coil. The apparatus also includes output means which is disposed on the front panel of the housing and electrically coupled to the circuitry. The output means includes a connection for operatively coupling an oscilloscope or a meter to the apparatus in order to examine the operation of the circuit.

In accordance with another object of the invention, the apparatus is provided with visual display means disposed on the front panel of the housing. The visual display means is operatively coupled to the circuitry. The visual display means informs the operator of the integrity of the windings of the inductive coil under test. The visual display means includes a number of light emitting diodes which are illuminated responsive to a reference signal which is indicative of the integrity of the windings of the inductive coil.

In accordance with another object of the invention, the apparatus is provided with means for allowing the operator to vary the impedance through the inductive coil being tested. An impedance switch is disposed on the front panel of the housing and electrically coupled to the circuitry. The impedance switch allows better results on the visual display by matching the impedance for vertical or horizontal yoke windings.

These and other objects of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1A:
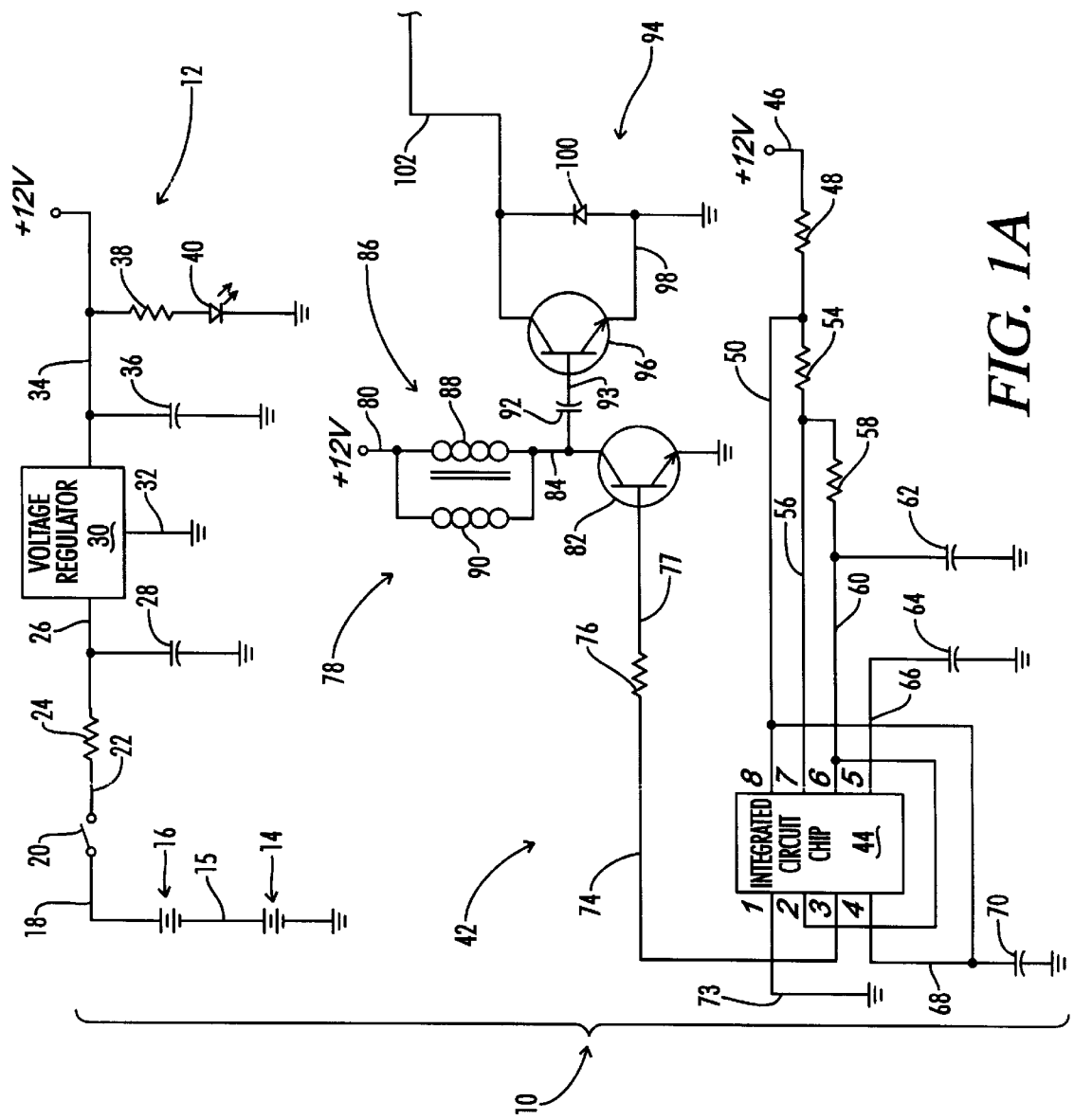
FIGS. 1A and 1B together make up a schematic of the circuitry of the apparatus of the present invention.
Figure 1B:
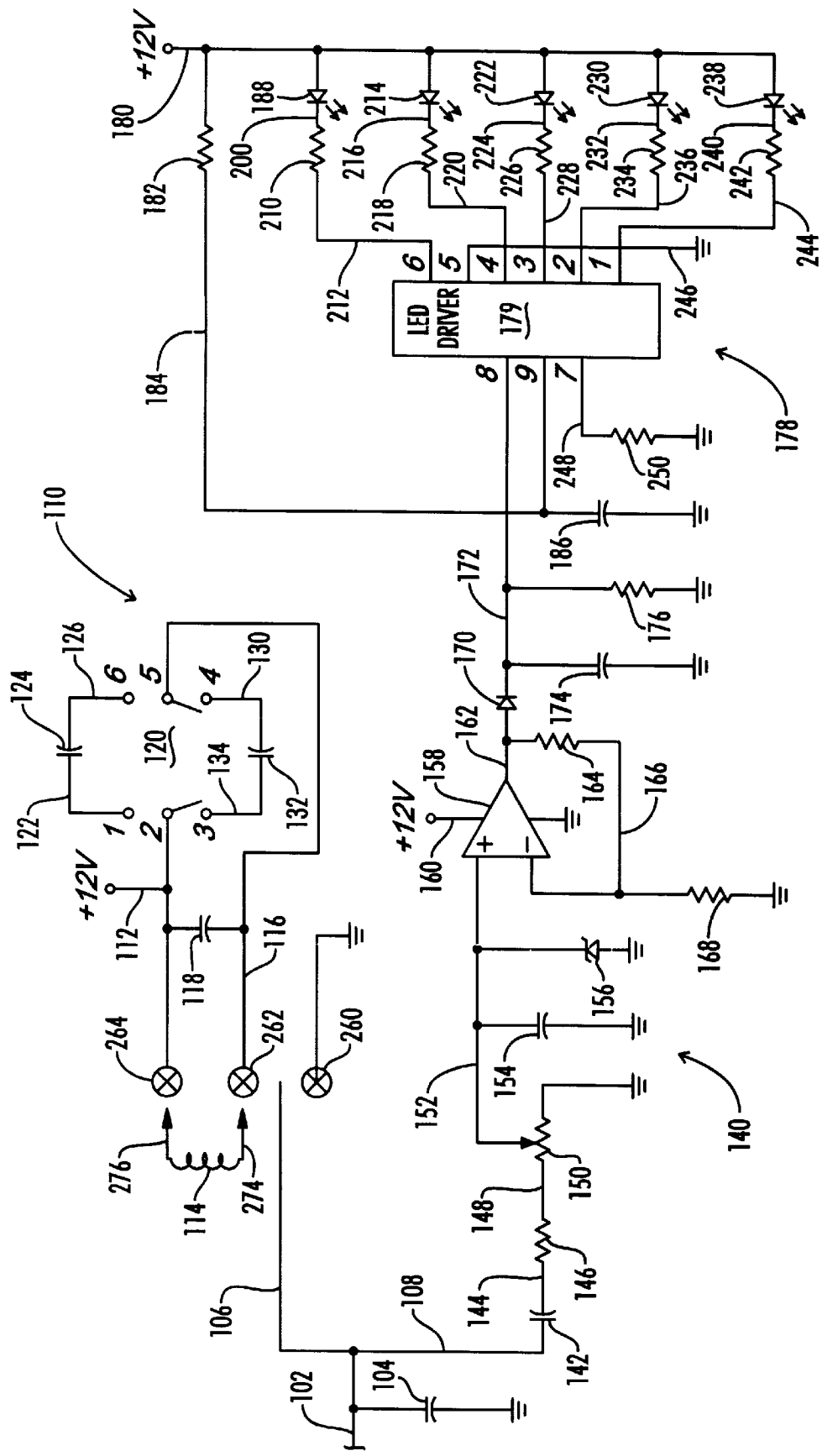

With reference to the drawings and initially to FIGS. 1A and 1B, a circuit 10 is shown for testing the integrity of the windings of inductive coils. The circuit 10 includes a power supply 12, a waveform generator 42, a voltage multiplier 78, an amplifier 94, a test portion 110, a comparator portion 140, and a display 178. The circuit is capable of testing the windings of any inductive coil, including yokes, flyback transformers, stator windings, etc.. The circuit 10 is disposed in a housing 252, which may be seen more particularly with reference to FIG. 2.

The power supply 12 consists of a direct current power source. In the preferred embodiment of the invention, the direct current power source is in the form of a first and second battery 14, 16 which are serially disposed. The first battery 14 is grounded at the negative end while its positive end is coupled to the negative end of the second battery 16 via line 15. The positive end of the second battery 16 is coupled to a single pole, single throw (S.P.S.T.) switch 20 via line 18. The first and second batteries 14, 16 each provide 9 volts of direct current. By coupling the first and second batteries 14, 16 in series, 18 volts of direct current is passed through line 18.

The S.P.S.T. switch 20 occupies only an open or closed position, thereby selectively providing direct current to the circuit 10. When the S.P.S.T. switch 20 is closed, it couples line 18 to line 22. Resistor 24 has one of its ends coupled to line 22 while the other end is coupled to line 26. Line 26 is also coupled to the positive plate of capacitor 28. Capacitor 28 has its negative plate coupled to the system ground. Capacitor 28 and resistor 24 function as an L-filter to control the current flowing from the first and second batteries 14, 16.

Line 26 directs the voltage from the first and second batteries 14, 16 to pin 3 of a voltage regulator 30. Pin 2 of the voltage regulator 30 is coupled to the system ground via line 32. The voltage regulator 30 produces a constant 12 volt direct current through pin 1. Line 34 is coupled to pin 1 in order to direct the voltage from the voltage regulator 30 to the circuit 10. Line 34 is also coupled to the positive plate of capacitor 36 and to one end of resistor 38. The negative plate of capacitor 36 is coupled to the system ground. Capacitor 36 functions to filter the signal from the voltage regulator 30. The opposite end of resistor 38 is coupled to the anode of diode 40. The cathode of diode 40 is coupled to the system ground. Diode 40 is a light emitting diode which, when illuminated, provides the user with visual confirmation that power is being provided to circuit 10.

The waveform generator 42 of the circuit 10 receives power from the power supply 12 via line 46. Line 46 is also coupled to one end of resistor 48. The opposite end of resistor 48 is coupled via line 50 to pin 8 of an integrated circuit (i.c.) chip 44 and to one end of resistor 54. In a preferred embodiment of the invention, a 555 timer circuit chip is selected to be used as i.c. chip 44. The opposite end of resistor 54 is coupled via line 56 to pin 7 of the i.c. chip 44 and to one end of resistor 58. The opposite end of resistor 58 is coupled via line 60 to pin 6 of the i.c. chip 44 and to the positive plate of capacitor 62. The negative plate of capacitor 62 is coupled to ground as illustrated. Line 50 is coupled to pin 4 of the i.c. chip 44 and the positive plate of capacitor 70 via line 68. The negative plate of capacitor 70 is coupled to the system ground. Line 60 is also coupled to pin 2 of the i.c. chip 44 via line 72. Pin 1 of the i.c. chip 44 is coupled to the system ground by line 73. Pin 3 of the i.c. chip 44 directs the output of the i.c. chip 44 to one end of resistor 76 via line 74. The opposite end of resistor 76 is coupled to the voltage multiplier 78 via line 77. The output from the i.c. chip 44 is a square wave having a frequency of approximately 15,750 Hz.

The voltage multiplier 78 of the circuit 10 includes a transformer 86 and a transistor 82. Line 77 couples one end of resistor 76 to the base of transistor 82. The emitter of transistor 82 is coupled to the system ground. The collector of transistor 82 is coupled via line 84 to the transformer 86 and the 10 amplifier 94. The transformer 86 receives 12 volts direct current from the power supply 12 via line 80. Line 80 is coupled to one end of the primary winding 88 and one end of the secondary winding 90 in the transformer 86. The opposite ends of the primary and secondary windings 88, 90 of the transformer 86 are coupled to the collector of transistor 82 via line 84.

Line 84 is coupled to the positive plate of capacitor 92. The negative plate of capacitor 92 is coupled to the base of transistor 96 via line 20 93. The emitter of transistor 96 is coupled to the anode of diode 100. The cathode of diode 100 is coupled to the collector of transistor 96 via line 102.

Referring to FIG. 18, line 102 couples the amplifier 94 to a capacitor 104. The positive plate of capacitor 104 is coupled to line 102 while the negative plate is coupled to the system ground. Line 102 also couples the amplifier 94 to the test portion 110 and the comparator portion 140 via lines 106 and 108, respectively.

As seen in FIG. 1B, the test portion 110 includes a double pole, triple throw (D.P.D.T.) switch 120 and a plurality of plug receptors 260, 262, 264. Plug receptor 260 is coupled to the system ground as illustrated. Line 106 is coupled to plug receptor 262 as is line 116. A 12 volt direct current is provided to the test portion 110 via line 112. Line 112 is coupled to pin 2 of D.P.T.T. switch 120, plug receptor 264, and the positive plate of capacitor 118. The negative plate of capacitor 118 is coupled to line 116. Line 116 is further coupled to pin 5 of D.P.T.T. switch 120. Pin 1 of D.P.T.T. switch 120 is coupled to the positive plate of capacitor 124 via line 122. The negative plate of capacitor 124 is coupled to pin 6 of D.P.T.T. switch 120 via line 126. Similarly, pin 3 of D.P.T.T. switch 120 is coupled to the positive plate of capacitor 132 via line 134. The negative plate of capacitor 132 is coupled to pin 4 of D.P.T.T. switch 120 via line 130.

The inductive coil 114 to be tested is coupled to the circuit 10 at two of the plug receptors. One end of inductive coil 114 is coupled to plug receptor 262 via line 274 while the opposite end of inductive coil 114 is coupled to plug receptor 264 via line 276. D.P.T.T. switch 120 is used for impedance matching and allows the operator to test inductive coils for shorted windings above 760 $\mu$H.

The comparator portion 140 includes an operational amplifier 158, a plurality of filters, and a zener diode 156. The comparator portion 140 is coupled, in part, to the test portion 110 via line 108. Line 108 is coupled to the positive plate of capacitor 142. The negative plate of capacitor 142 is coupled to one end of resistor 146 via line 144. The opposite end of resistor 146 is coupled to one end of variable resistor 150 via line 148. The opposite end of variable resistor 150 coupled to ground and is also adjustably coupled to line 152 as illustrated in FIG. 1B.

Line 152 couples variable resistor 150 to a capacitor 154, the zener diode 156, and the operational amplifier 158.

Capacitor 154 has its positive plate coupled to line 152 while its negative plate is coupled to the system ground. Line 152 is coupled to the cathode of zener diode 156 and the anode of zener diode 156 is coupled to the system ground. Zener diode 156 allows an 18 volt direct current to pass to the operational amplifier 158. Line 152 is further coupled to the normal input of the operational amplifier 158. The operational amplifier 158 receives a 12 volt direct current from the power supply 12 via line 160. The output of the operational amplifier 158 is coupled to the anode of diode 170 and one end of resistor 164 via line 162. The opposite end of resistor 164 is coupled to one end of resistor 168 and fed back to the operational amplifier 158 via line 166. The opposite end of resistor 168 is coupled to the system ground. The cathode of diode 170 couples the comparator portion 140 to the display 178 via line 172. The operational amplifier 158 provides a signal which is indicative of the state of the inductive coil being tested.

When the amplifier 94 is activated, it induces current into the inductive coil 114 which is being tested. The resulting current is passed to the non-inverting input of the comparator stage 140 and into the amplifier 94. The portion of the current received by the amplifier 94 is passed directly to ground. Capacitor 142 blocks current from passing from the comparator stage 140 to the amplifier 94. A negative feedback loop is created between the output and inverting input of operational amplifier 158, so that operational amplifier 158 continuously compares the current signal being received to the previous signal, at the frequency established by the waveform generator.

The display 178 includes an LED driver 179 and a plurality of LED's. The LED driver 179 is coupled at pin 8 to a resistor 176, a capacitor 174, and the cathode of diode 170 via line 172. The LED driver 179 receives the analog output signal from the operational amplifier 158 and converts it to a digital signal capable of driving the LED display 179. Capacitor 174 has its positive plate coupled at line 172 while its negative plate is coupled to the system ground. Resistor 176 has one of its ends coupled to line 172 and the other end coupled to the system ground. A 12 volt direct current is provided to the display system 178 via line 180, which is coupled to a resistor 182 and a plurality of LED's. Resistor 182 has one of its ends coupled to line 180 and the other end is coupled to the positive plate of capacitor 186 and pin 9 of the LED driver 179 via line 184. The negative plate of capacitor 186 is coupled to the system ground.

LED 238 has its anode coupled to line 180 and its cathode coupled to one end of resistor 242 via line 240. The opposite end of resistor 242 is coupled to pin 1 of the LED driver 179 via line 244. LED 230 has its anode coupled to line 180 and its cathode coupled to one end of resistor 234 via line 232. The opposite end of resistor 234 is coupled to pin 2 of the LED driver 179 via line 236. LED 222 has its anode coupled to line 180 and its cathode coupled to one end of resistor 226 via line 224. The opposite end of resistor 226 is coupled to pin 3 of the LED driver 179 via line 228. LED 214 has its anode coupled to line 180 and its cathode coupled to one end of resistor 218 via line 216. The opposite end of resistor 218 is coupled to pin 4 of the LED driver 179 via line 220. LED 188 has its anode coupled to line 180 and its cathode coupled to one end of resistor 210 via line 200. The opposite end of resistor 210 is coupled to pin 6 of the LED driver 179 via line 212. Pin 5 of LED driver 179 is coupled to the system ground via line 246, as shown. Pin 7 of LED driver 179 is coupled to one end of resistor 250 via line 248. The opposite end of resistor 250 is coupled to the system ground.

During the testing phase, the circuit 10 creates a waveform which is very similar to that present in a television set or crt monitor. The waveform created by the circuit, however, has approximately 1/10th of the peak to peak voltage present in a television set or crt monitor. If the inductive coil under test contains no shorted windings, then a continuous waveform will be produced. However, if the inductive coil contains a shorted turn, then the waveform produced will have the same amplitude but will contain oscillations. These oscillations may be detected by the operational amplifier 158 by comparing the current signal being received with the signal in the feedback loop. The output signal of the operational amplifier 158 is indicative of the condition of the inductive coil being tested. When the LED driver 179 receives this signal, it interprets the signal and converts it to digital form in order to drive the LED's and visually inform the operator of the integrity of the inductive coil.

Figure 2:
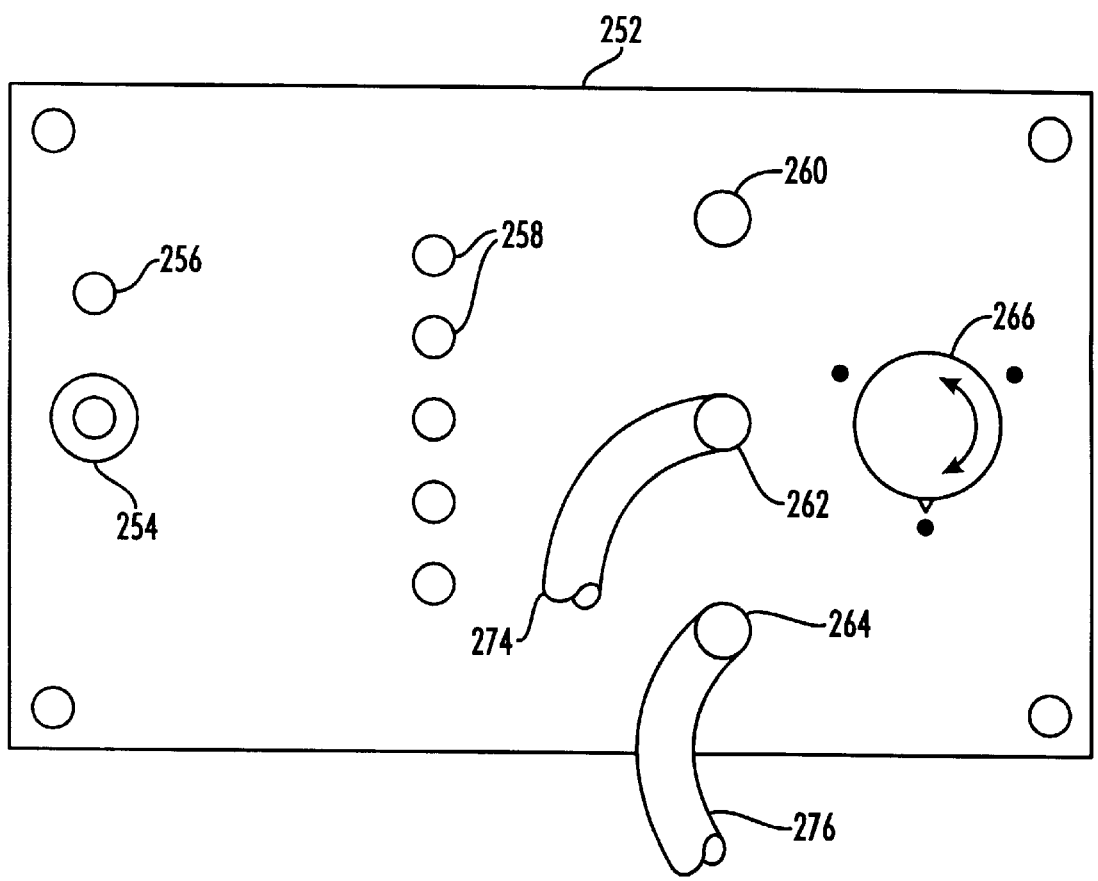
FIG. 2 is a front elevational view of the housing of the apparatus of the present invention.

FIG. 2 illustrates the housing 252 within which the circuit 10 may be disposed. The housing 252 includes a power button 254 which is in communication with S.P.S.T. switch 20. When power button 254 is activated, it closes S.P.S.T. switch 20 and allows current from batteries 14 and 16 to flow through the circuit. Actuation of power button 254 also induces current through LED 40. LED 40 responsively illuminates to indicate to the operator that current is flowing through the circuit 10. The housing also includes a visual indicator 258 which is in communication with the LED's of the display 178. The visual indicator 258 may include filters of multiple colors so that when the LED's of display 178 are activated in response to the condition of the coil, predetermined patterns of light will be provided to the operator. Equivalently, the LED's of display 178 may be selected in varying colors and arranged in such a manner as to visually represent the integrity of the inductive coil under test, thus eliminating the need for filters. Knob 266 corresponds to the mechanical portion of D.P.T.T. switch 120. Knob 266 is illustrated as being rotatably capable of occupying three distinct positions. Each position operable by D.P.T.T. switch 120 corresponds to a predetermined impedance which may be placed across the inductive coil being tested.

While it may not be readily apparent, it should be appreciated that the housing 252 is relatively small thereby making the apparatus portable and extremely convenient for use by field operators. The apparatus is also convenient for use in a lab settings where an oscilloscope may be readily attached to it in order to examine the signature of the coil being tested.

Figure 3:
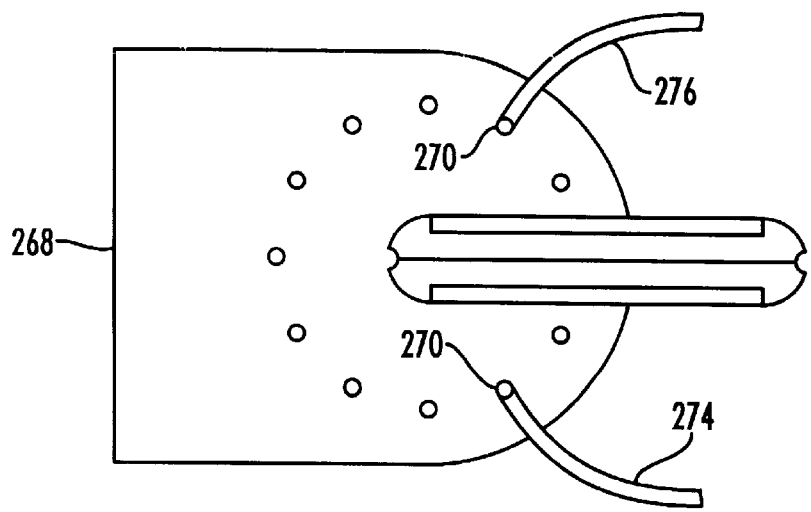
FIG. 3. is a flyback transformer being tested by the apparatus of the present invention.

Referring additionally to FIG. 3, a flyback transformer 268 is illustrated. The flyback transformer includes a plurality of accesses 270 to its primary windings. In order to test the integrity of the windings of flyback transformer 268, lines 274 and 276 are attached to two of the accesses 270 and placed in communication with the circuit 10 of the present invention. The connection is accomplished via the housing 252 wherein plug receptor 264 receives line 276 while plug receptor 262 receives line 274. When the power button 254 is actuated, current is induced through the windings of the flyback transformer 268. The operator may additionally connect a meter or oscilloscope to plug receptors 260 and 262 in order to examine the electrical signature from the inductive coil being tested.

While the ratings of the various components may vary based on specific application, a preferred embodiment of the invention may incorporate the values suggested in table 1 for testing a variety of windings.

TABLE 1

| Reference No. | Value or Part No. |
| --- | --- |
| Resistor 24 | 2.2 Ohms 1/2W |
| Resistor 38 | 1K Ohms 1/4W |
| Resistor 58 | 18K Ohms 1/4W |
| Resistor 54 | 3.9K Ohms 1/4W |
| Resistor 48 | 330 Ohms 1/4W |
| Resistor 76 | 470 Ohms 1/4W |
| Resistor 146 | 100K Ohms 1/4W |
| Resistor 150 | 50K POT |
| Resistors 218, 226, 234, 242 | 1K Ohms 1/4W |
| Resistor 168 | 100 Qhms 1/4W |
| Resistor 164 | 4.7K Ohms 1/4W |
| Resistor 182 | 470 Ohms 1/4W |
| Resistor 250 | 33K Ohms 1/4W |
| Resistor 176 | 100 Ohms 1/4W |
| Voltage Regulator 30 | 7812 |
| Timer 44 | NE555N |
| Qperational Amplifier 158 | LM324N |
| LED Driver 179 | AN6884 |
| Capacitor 28 | 1000 $\mu$Fd 35V |
| Capacitor 36 | 1000 $\mu$Fd 25V |
| Capacitor 64 | .01 $\mu$Fd 50V |
| Capacitor 62 | .0022 $\mu$Fd 50V |
| Capacitor 70 | 47 $\mu$Fd 25V |
| Capacitor 92 | 1000 $\mu$Fd 25V |
| Capacitor 142 | .001 $\mu$Fd 200V |
| Capacitor 154 | .068 $\mu$Fd 25V |
| Capacitor 174 | 1 $\mu$Fd 25V |
| Capacitor 132 | 8200 Pica Fd 200V |
| Capacitor 124 | 18000 Pica Fd 200V |
| Capacitor 118 | .001 $\mu$Fd 200V |
| Capacitor 104 | .001 $\mu$Fd 200V |
| Capacitor 186 | 100 $\mu$Fd 25V |
| Transistor 82 | MPS-A05 |
| Transistor 96 | ECG-171 |
| Diode 40 | ECG-3007 |
| Diode 100 | ECG-558 |
| Diode 156 | ECG-5012A, 18V |
| Diode 188 | ECG-3007 |
| Diode 214, 222, 230, 238 | ECG-3010 |
| Diode 170 | 1N4149 |
| Primary 88 | 750 mH |
| Secondary 90 | 750 mH |
| Switch 20 | Momentary S.P.S.T |
| Switch 120 | Three position (D.D.D.T) |

It is to be understood that the present invention is not limited to the sole embodiment described above, but encompasses any and all embodiments within the scope of the following claims.

What is claimed is:

1. Apparatus for testing an inductive coil comprising:
   power supply means for providing a d.c. voltage and current flow;
   a circuit connected to the power supply means including:
   timing means for generating a frequency pulse train,
   means for multiplying the d.c. voltage in said circuit to generate a multiplied output, said means for multiplying the d.c. voltage including means for receiving said frequency pulse train,
   amplification means, coupled to said voltage multiplying means and adapted to receive the multiplied output, the amplification means adapted for amplifying the current across the inductive coil,
   a comparator for comparing an instantaneous voltage across the inductive coil to a reference voltage, and
   output means, coupled to said comparator, for producing a signal indicative of the state of the inductive coil; and
   means for connecting the inductive coil to said circuit to generate the instantaneous voltage.

2. Apparatus as recited in claim 1 wherein said output means includes a meter.

3. Apparatus as recited in claim 1 wherein said output means comprises an oscilloscope.

4. Apparatus as recited in claim 1, wherein said power supply means includes:

a source of stored electrical energy;

switch means for selectively allowing a flow of current from said source of stored electrical energy to said circuit;

a plurality of filters for controlling the flow of current from said source of stored electrical energy to said circuit;

means for regulating the voltage applied to said circuit; and indicator means for visually indicating when said power supply means is operational.

5. Apparatus as recited in claim 1 wherein said means for multiplying the voltage includes a transformer and a transistor.

6. Apparatus as recited in claim 1 wherein said comparator is an operational amplifier.

7. Apparatus as recited in claim 1 wherein said means for connecting the inductive coil to said circuit includes means for varying an impedance placed across the inductive coil, said means connected to said circuit.

8. Apparatus as recited in claim 7 wherein said means for varying the impedance comprises a double pole triple throw switch.

9. Apparatus as recited in claims 1 further comprising a housing for enclosing said apparatus.

10. Apparatus as recited in claim 9 wherein said power supply means comprises at least one battery disposed within said housing.

11. Apparatus as recited in claim 9 wherein said housing includes visual display means coupled to said output means.

12. Apparatus as recited in claim 11 wherein said visual display means includes a plurality of light emitting diodes.

13. An apparatus for testing an inductive coil comprising:

a power supply means for providing a direct current voltage and current flow;

an oscillator connected to the power supply means for generating a waveform;

an amplification means connected to the oscillator for receiving and amplifying the waveform;

a connecting means electrically connected to the amplification means and adapted to connect the inductive coil being tested to the amplification means;

a comparator electrically connected to the connecting means, the comparator adapted to receive the instantaneous voltage across the inductive coil and generate a comparator signal indicative of the condition of the coil by comparing the instantaneous voltage to a feedback signal generated from the comparator signal; and an output means coupled to said comparator for receiving the comparator signal and producing an output signal indicative of the state of the inductive coil.

14. The apparatus as recited in claim 13, wherein the comparator is an operational amplifier.

15. The apparatus as recited in claim 13, wherein the operational amplifier is adapted to continuously compare the instantaneous voltage across the inductive coil to the feedback signal at a frequency of the waveform.

16. The apparatus as recited in claim 13, wherein the feedback signal is generated by a multiple resistor voltage divider electrically connected to the comparator.

* * * * *